United States Patent
Park et al.

(10) Patent No.: US 7,245,542 B2
(45) Date of Patent: Jul. 17, 2007

(54) MEMORY DEVICE HAVING OPEN BIT LINE CELL STRUCTURE USING BURN-IN TESTING SCHEME AND METHOD THEREFOR

(75) Inventors: Ki-Won Park, Gyeonggi-do (KR); Byung-Sik Moon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 11/223,321

(22) Filed: Sep. 8, 2005

(65) Prior Publication Data

US 2006/0056252 A1 Mar. 16, 2006

(30) Foreign Application Priority Data

Sep. 10, 2004 (KR) ...................... 10-2004-0072406

(51) Int. Cl.
G11C 29/00 (2006.01)
(52) U.S. Cl. .................. 365/201; 365/203; 365/230.03
(58) Field of Classification Search ................ 365/201, 365/203, 230.03
See application file for complete search history.

(56) References Cited

U.S. PATENT DOCUMENTS

| 4,991,139 A * | 2/1991 | Takahashi et al. .......... 365/201 |
| 5,844,833 A | 12/1998 | Zagar et al. |
| 5,953,275 A | 9/1999 | Sugibayashi et al. |
| 6,259,638 B1 | 7/2001 | Kim |
| 6,534,439 B2 | 3/2003 | Van den Tillaart et al. |
| 6,650,584 B2 | 11/2003 | Cowles |

FOREIGN PATENT DOCUMENTS

KR  2000-0019078  4/2000

OTHER PUBLICATIONS

English language abstract of Korean Publication No. 2000-0019078.

* cited by examiner

Primary Examiner—Richard T. Elms
Assistant Examiner—N Nguyen
(74) Attorney, Agent, or Firm—Marger Johnson & McCollom, P.C.

(57) ABSTRACT

A memory device having an open bit line cell structure uses a wafer burn-in testing scheme and a method for testing the same. The memory device includes a sense amplifier having first and second input terminals; a bit line connected to the first input terminal of the sense amplifier and extended in a first direction; an inverted bit line connected to the second input terminal of the sense amplifier and extended in a second direction; and a voltage supply means for applying the same voltage to the bit line and the inverted bit line in a precharge operation mode and applying a different level voltage to the bit line and the inverted bit line in a burn-in test operation mode. It is possible to efficiently screen defects of memory cells and between bit lines by performing a wafer burn-in test using a wafer burn-in scheme on a memory device having an open bit line cell structure.

11 Claims, 8 Drawing Sheets

MEMORY DEVICE HAVING OPEN BIT LINE CELL STRUCTURE USING BURN-IN TESTING SCHEME AND METHOD THEREFOR

CROSS-REFERENCE TO RELATED APPLICATION

This application claims the benefit of Korean Patent Application No. 10-2004-0072406, filed Sep. 10, 2004, the disclosure of which is hereby incorporated herein by reference in its entirety.

BACKGROUND

1. Technical Field

The present invention relates to a burn-in testing device and method, and more particularly, to a memory device having an open bit line cell structure that uses a wafer burn-in testing scheme and a method for testing the same.

2. Discussion of Related Art

Wafer burn-in (WBI) testing performed on a wafer has been widely used as a method for screening weak cells in a semiconductor memory device. In the WBI testing method, a high operation voltage is generally applied at a high temperature. To shorten test time, a number of word lines in each memory block are simultaneously activated. Subsequently, data is written to a plurality of memory cells and sensed in a certain time. As such, to screen the weak cells, stress is applied to the memory cells.

FIG. 1 illustrates a typical folded bit-line cell structure. In a conventional WBI test, a write operation begins by simultaneously activating even word lines WL0 and WL2 or odd word lines WL1 and WL3 of word lines in memory blocks 110 and 120. A desired voltage is then applied to an external pad so that a voltage VBL is applied and written to all cells in the memory blocks via a voltage equalizing circuit 140.

Further, in a sensing operation subsequent to the write operation for the WBI test, all the word lines in the memory block are simultaneously activated and a sensing enable signal PSE is applied to a sense amplifier 130. The sense amplifier amplifies and senses a voltage difference between a pair of bit lines to screen for defects of bridges between the bit line pairs. The WBI test is disclosed in Korean Patent No. 281900 and U.S. Pat. No. 6,259,638.

FIG. 2 illustrates a typical memory device having an open bit-line cell structure. Bit lines BL and inverted bit lines /BL extend to both sides of a sense amplifier 230. Memory cells are formed at intersection regions of the bit lines and word lines.

When the same WBI write method as that in the folded bit line structure shown in FIG. 1 is applied to the memory device of FIG. 2, e.g., when first word line WL0 and third word line WL2 in memory blocks 210 and 220 are simultaneously activated, and then, an external voltage VBL is applied and written to memory cells via a voltage equalizing circuit 240, only the same voltage (data) is always written to the memory cells which are connected to the first and third word lines WL0 and WL2 via the bit lines and the inverted bit lines.

Because the same voltage (data) is written to memory cells upon activating all word lines and then applying a sensing enable signal PSE to carry out WBI sensing operation after the write operation is completed, a voltage difference is not generated between the bit line and the inverted bit line. Consequently, sensing operation is not performed and in turn defects of bridges between the bit lines cannot be screened.

Accordingly, a need remains for a method for burn-in test directed to a memory device having an open bit line cell structure.

SUMMARY OF THE INVENTION

The present invention provides a method capable of performing the same kind of wafer burn-in sensing operation as that in a memory device having a folded bit line cell structure, in a memory device having an open bit line cell structure, and a memory device therefore.

According to an aspect of the present invention, a memory device includes a sense amplifier having first and second input terminals; a bit line connected to the first input terminal of the sense amplifier and extended in a first direction; an inverted bit line connected to the second input terminal of the sense amplifier and extended in a second direction; and a voltage supply means for applying the same voltage to the bit line and the inverted bit line in a precharge operation mode and applying a different level voltage to the bit line and the inverted bit line in a burn-in test operation mode.

According to another aspect of the present invention, a memory device includes first and second memory blocks composed of cells having an open bit line structure and adjacent to each other; a wafer burn-in block selecting unit for outputting a first or second burn-in block enable signal for a relevant memory block in response to a burn-in signal and a memory block address; an internal address generating unit for generating an internal low address in response to the burn-in signal and the external address; and a row decoder for enabling the word line in response to the internal low address and the burn-in block enable signal for the memory block.

According to yet another aspect of the present invention, a burn-in testing method includes applying a burn-in signal; applying a first memory block address and a word line selection address; generating a first block enable signal in response to the burn-in signal and the first memory block address; generating an internal address in response to the burn-in signal and the address; and activating word lines in a relevant memory block in response to the first block enable signal and the internal address.

BRIEF DESCRIPTION OF THE DRAWINGS

The foregoing and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided as teaching examples of the invention. Like numbers refer to like elements.

Figure 1:
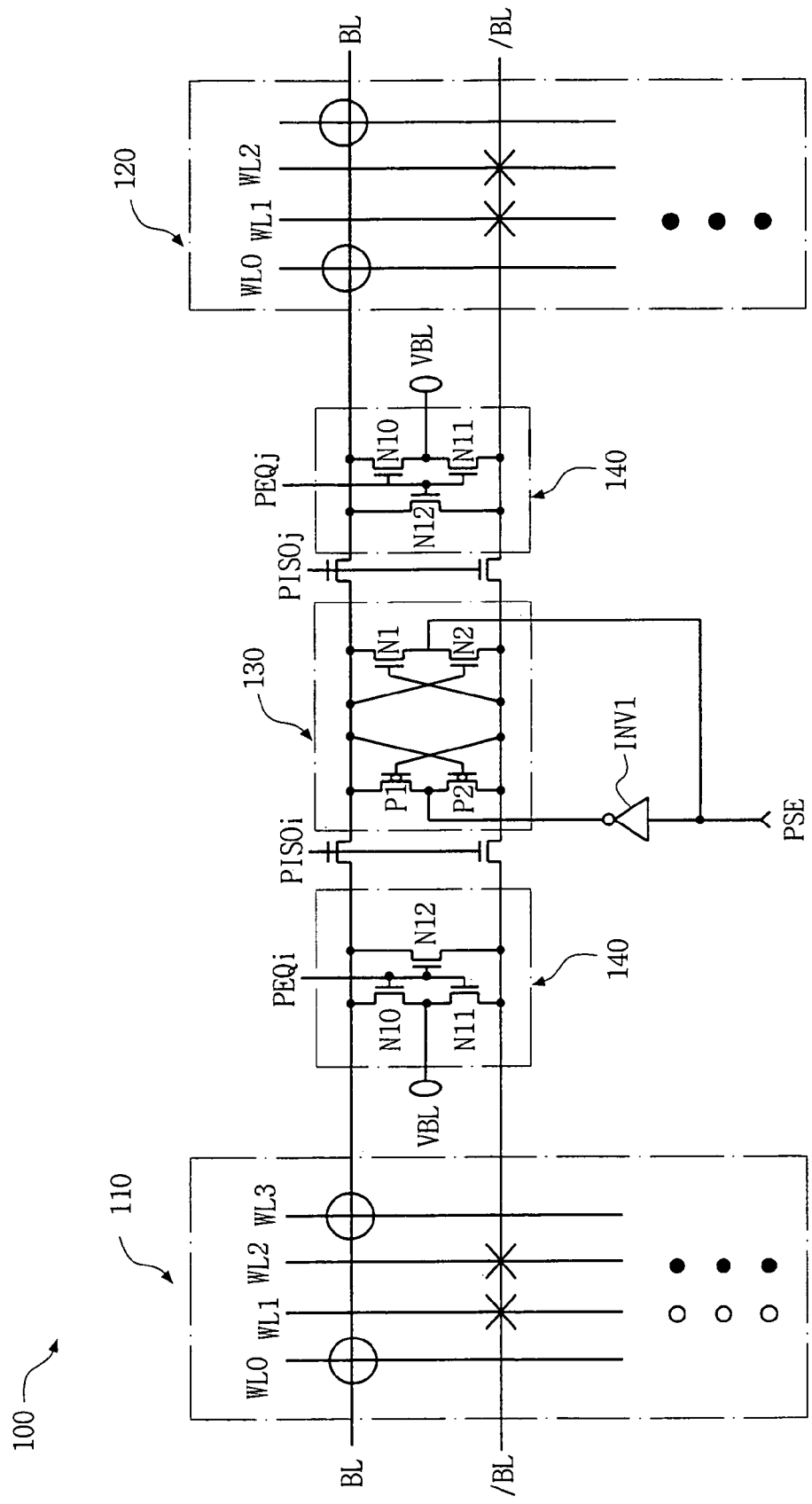
FIG. 1 illustrates a typical memory device having a folded bit-line cell structure.
Figure 2:
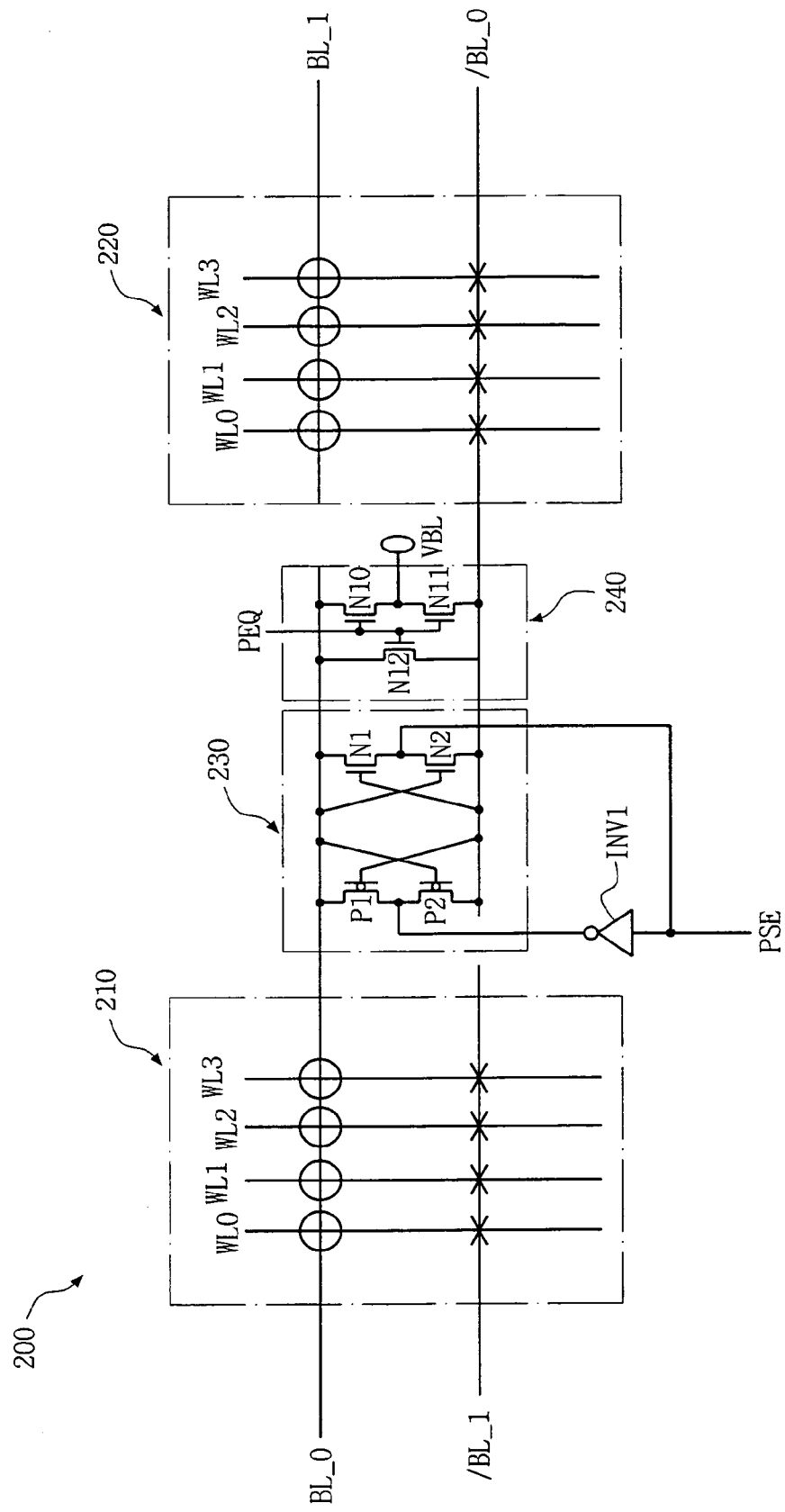
FIG. 2 illustrates a typical memory device having an open bit-line cell structure.
Figure 3:
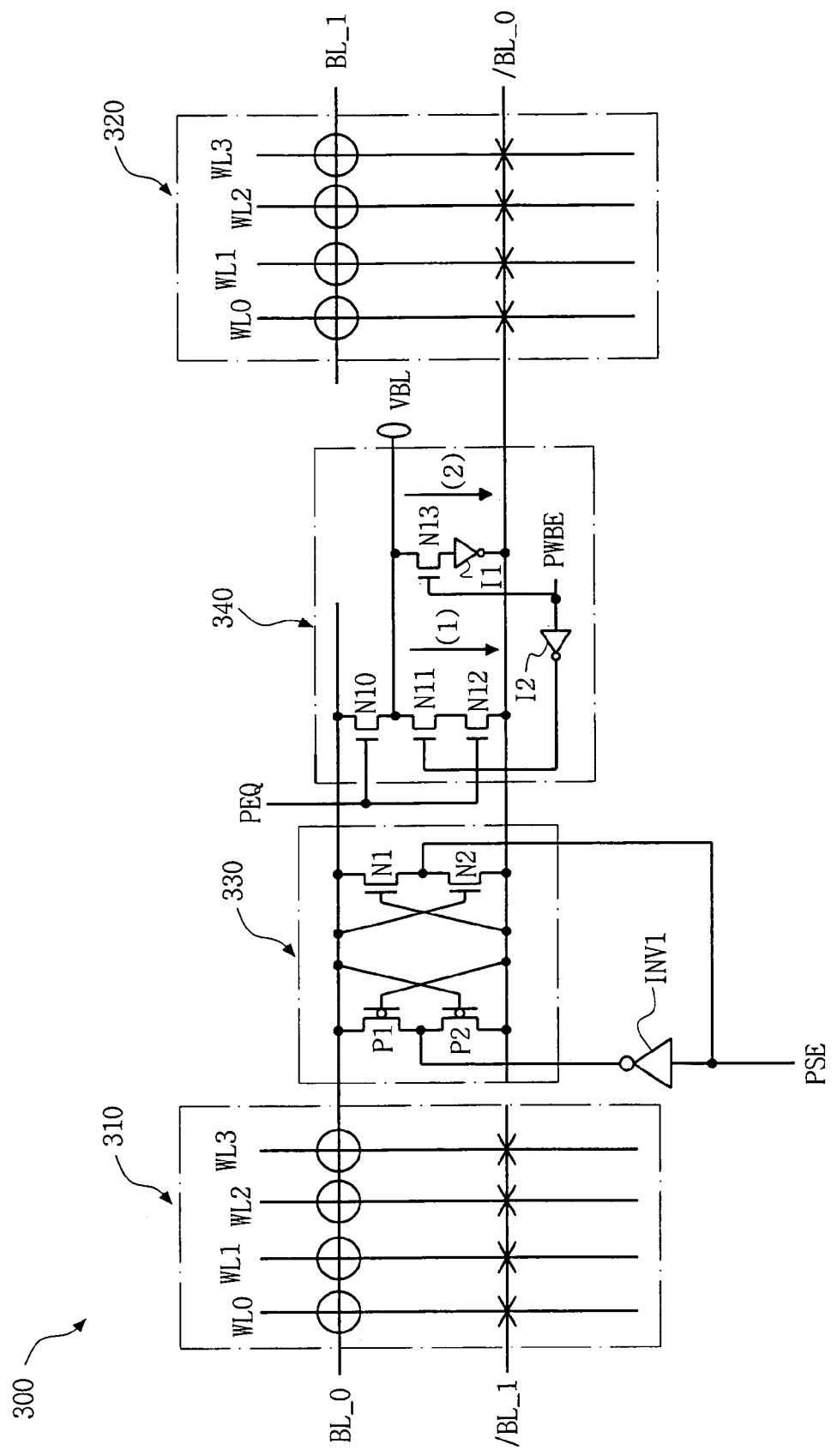
FIG. 3 is a circuit diagram of a memory device which includes a wafer burn-in testing circuit according to an embodiment of the present invention.

FIG. 3 illustrates a memory device having a burn-in testing circuit according to an embodiment of the present invention. Referring to FIG. 3, the memory device circuit is the same as that of FIG. 2 except for a voltage supply circuit 340. The voltage supply circuit 340 is composed of an external voltage supply terminal VBL, transistors N10, N11, N12 and N13 and inverters I1 and I2.

Transistors N10, N11 and N12 are connected in series between bit line BL_0 and inverted bit line /BL_Ø, as follows: The transistor N10 has a first terminal connected to a bit line BL_0, a second terminal connected to the voltage supply terminal VBL, and a gate connected to an equalization control signal PEQ. The transistor N11 has a first terminal connected to both the second terminal of transistor N10 and the voltage supply terminal VBL, a second terminal connected to a first terminal of the transistor N12, and a gate connected to an inverted version of a wafer burn-in enable signal PWBE. The transistor N12 has the first terminal connected to the second terminal of the transistor N11, a second terminal connected to an inverted bit line /BL_0, and a gate connected to the equalization control signal PEQ.

Transistor N13 and inverter I1 are connected in series between voltage supply terminal VBL and inverted bit line /BL_Ø in parallel with transistors N11 and N12. The transistor N13 has a first terminal connected to the voltage supply terminal, a second terminal connected to the inverter I1, and a gate connected to the wafer burn-in enable signal PWBE. The inverter I1 has an output connected to the inverted bit line /BL_0.

Operation of the wafer burn-in testing circuit shown in FIG. 3 will be now described.

In a normal operation, the wafer burn-in enable signal PWBE is low and the equalization control signal PEQ is high in a precharge operation period of the memory device. The transistor N10 is turned on by the PEQ signal and passes a voltage on the voltage supply terminal VBL to the bit line. The transistor N11 is turned on by the inverted version of the signal PWBE and the transistor N12 is turned on by the PEQ signal and passes the voltage on the voltage supply terminal VBL to the inverted bit line. The voltage level on the voltage supply terminal commonly is half an operation voltage level.

In a write operation, the enable signal PWBE becomes high and the equalization control signal PEQ is also high. In this case, the transistor N10 is turned on by the high PEQ signal and passes the voltage on the voltage supply terminal VBL to the bit line, but the transistor N11 is turned off by the low inverted version of the signal PWBE. Consequently, the applied voltage is not passed to the inverted bit line. The transistor N13 is turned on by the high PWBE and passes an inverted version of the voltage on the voltage supply terminal VBL to the inverted bit line via the inverter I1. In the wafer burn-in test, the voltage on the voltage supply terminal becomes either an operation voltage or a ground voltage depending on a high or low state of data to be written to the memory cell.

In other words, in the wafer burn-in test on the memory device having the open bit line cell structure, it is possible to apply individually a different voltage to the memory cell connected to the bit line and the memory cell connected to the inverted bit line, thus enabling a wafer burn-in sensing task.

Figure 4:
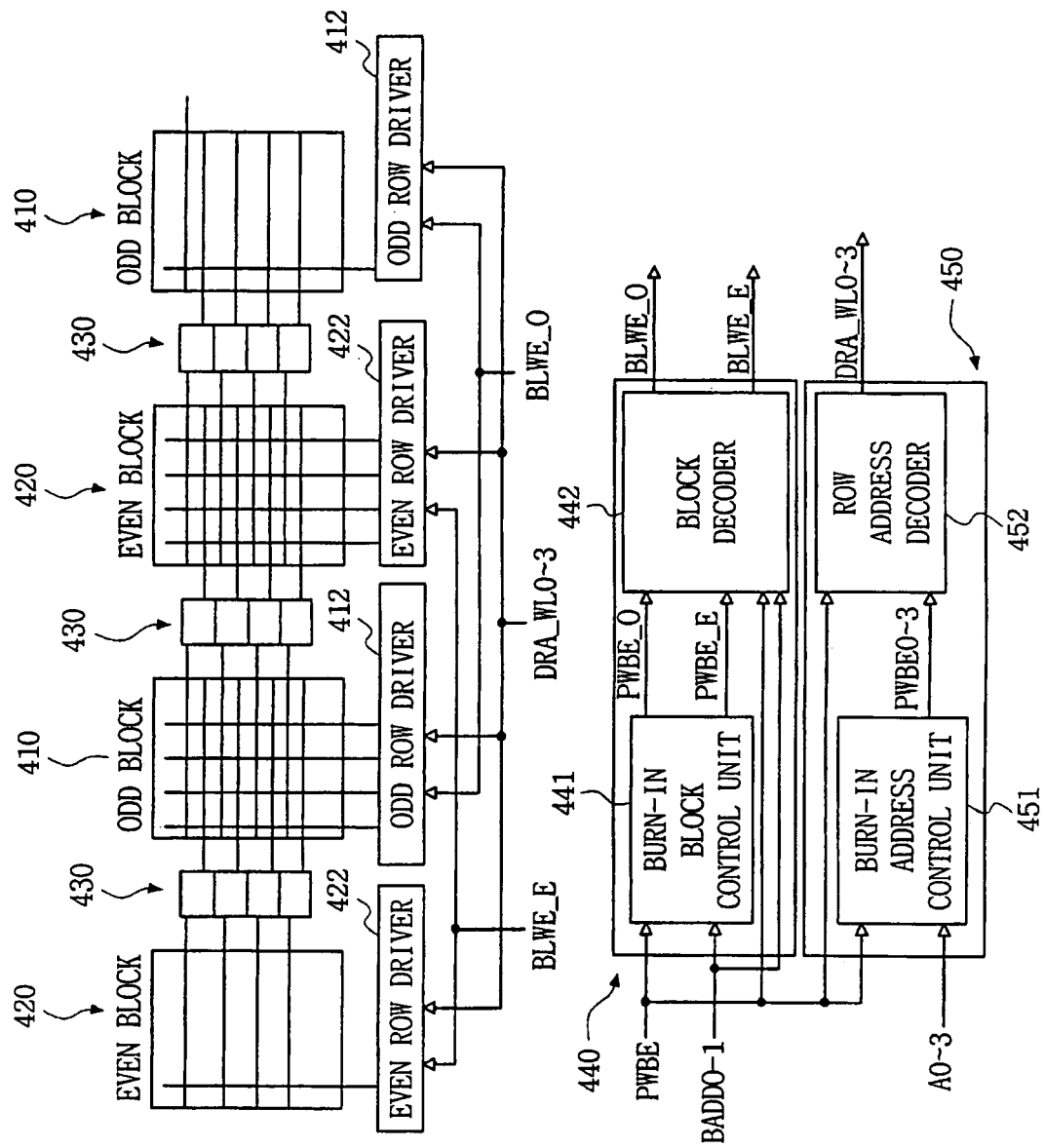
FIG. 4 is a block diagram of a memory device using a wafer burn-in testing scheme according to another embodiment of the present invention.

FIG. 4 illustrates a memory device using a wafer burn-in testing scheme according to another embodiment of the present invention.

Referring to FIG. 4, the memory device using a wafer burn-in scheme according to the present invention includes memory blocks (odd/even blocks) 410 and 420, sense amplifier and equalizers 430, a wafer burn-in block selecting circuit 440, an internal address generator 450, and word line drivers 412.

The memory blocks 410 and 420 have the open bit line cell structure and include a number of odd and even memory blocks.

The sense amplifier and equalizers 430 have the same structure as the sense amplifier 230 and voltage equalizer 240 shown in FIG. 2.

The wafer burn-in block selecting circuit 440 includes a burn-in block control unit 441 and a block decoder 442. The burn-in block control unit 441 generates block control signals PWBE_E and PWBE_O in response to a wafer burn-in enable signal PWBE and memory block addresses BADD0 and BADD1. The block decoder 442 generates block word line enable signals BWLE_E and BLWB_O in response to the block address BADD0 and the block control signals PWBE_E and PWBE_O.

The internal address generator 450 includes a burn-in address control unit 451 and a row address decoder 452. The burn-in address control unit 451 generates burn-in addresses PWBE0~3 in response to the wafer burn-in enable signal PWBE and external addresses A0~A3. The row address decoder 452 generates internal low addresses DRA_WL0~3 in response to the wafer burn-in enable signal PWBE and the burn-in addresses PWBE0~3.

The word line driver 412 activates a corresponding word line in response to block word line enable signals BWLE_O and BWLE_E and the internal low addresses (DRA_WL0~3) for the corresponding memory block.

Figure 5:
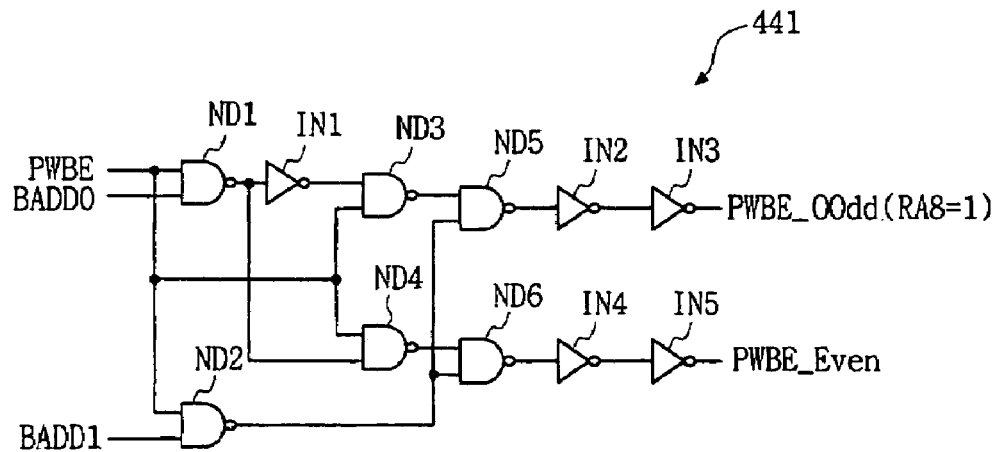
FIG. 5 is a detailed circuit diagram of a burn-in block control unit shown in FIG. 4.

FIG. 5 is a detailed circuit diagram of an example of the burn-in block control unit 441 shown in FIG. 4.

Referring to FIG. 5, the burn-in block control unit 441 includes NAND gates ND1 to ND6 and inverters IN1 to IN5 connected as shown. In wafer burn-in, PWBE becomes high and PWBE_O or PWBE_E is activated depending on a logic state of BADD0. In other words, when PWBE is high and BADD0 is high (ODD block address) to activate a word line of the odd memory block, PWBE_O is enabled to be high so that the word line of the odd memory block is activated. Further, when PWBE is high and BADD1 is high, both PWVE_O and PWBE_E are enabled to be high so that the word line of the memory block is activated.

Figure 6:
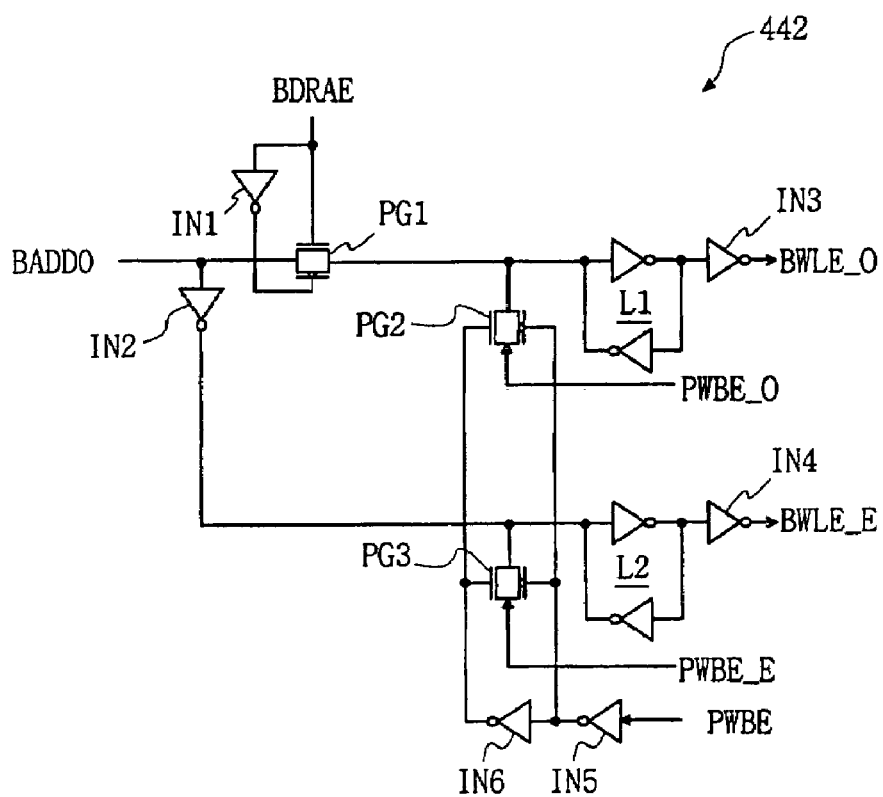
FIG. 6 is a detailed circuit diagram of a block decoder shown in FIG. 4.

FIG. 6 illustrates an example of the block decoder 442 shown in FIG. 4. The block decoder 442 is composed of transmission gates PG1 to PG3, latches L1 and L2, and inverters IN1 to IN6. In the normal operation of the memory device, the block decoder receives a memory block address BADD0 when a block decoder enable BDRAE becomes high, but in the wafer burn-in test, the BDRAE becomes logic low and the normal address is blocked, such that the block decoder generates the block control signal PWBE_E and PWBE_O as block word line enable signals BWLE_E and BLWE_O in response to the signal PWBE.

Figure 7:
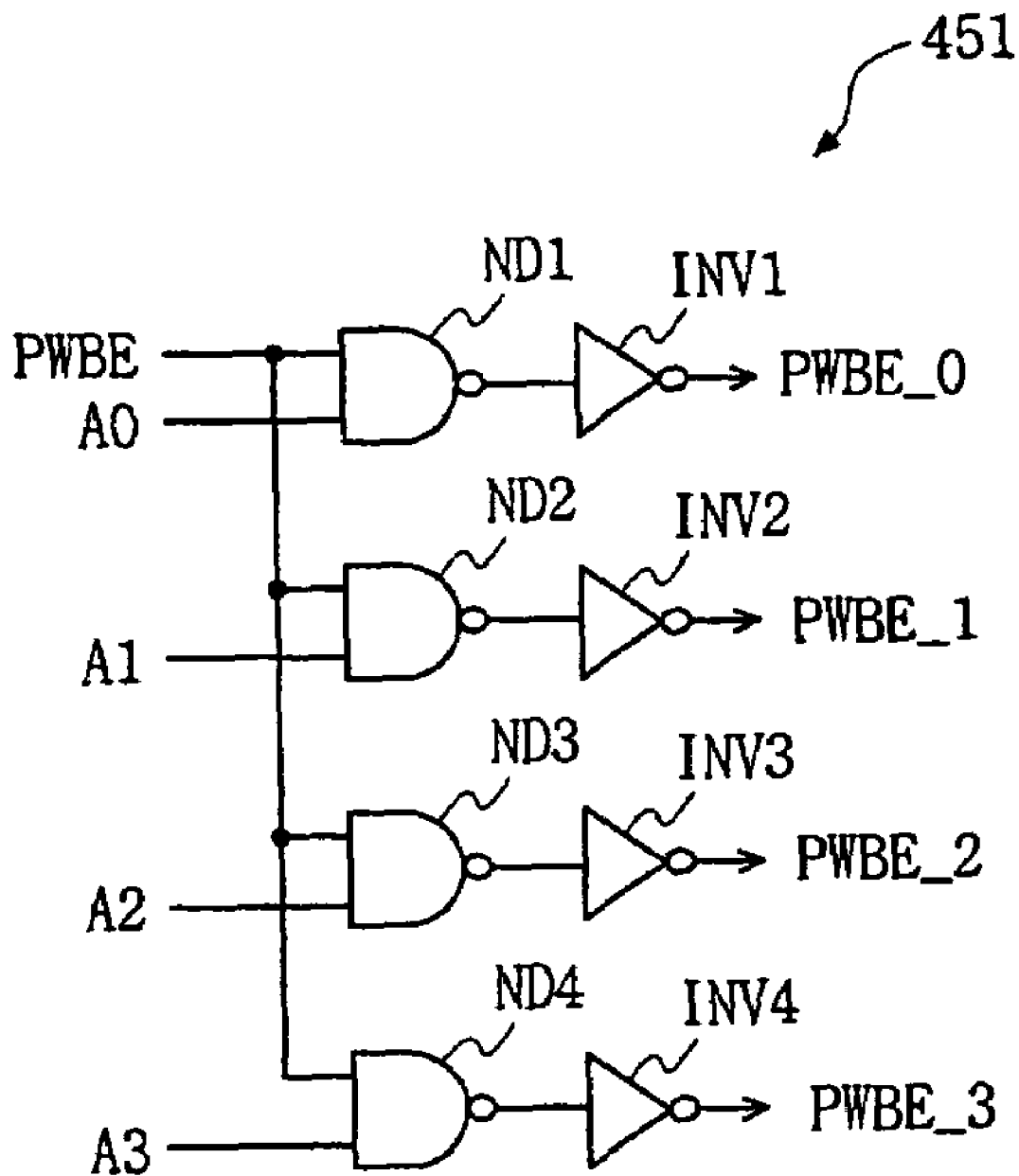
FIG. 7 is a detailed circuit diagram of a burn-in word line control unit shown in FIG. 4.

FIG. 7 illustrates an example of the burn-in address control unit 451 shown in FIG. 4. The burn-in address control unit is composed of NAND gates ND1–ND4 respectively in series with inverters NV1–INV4. The burn-in address control unit ANDs the wafer burn-in enable signal PWBE and the external addresses A0~3 to generate the burn-in addresses PWBE0~3.

Figure 8:
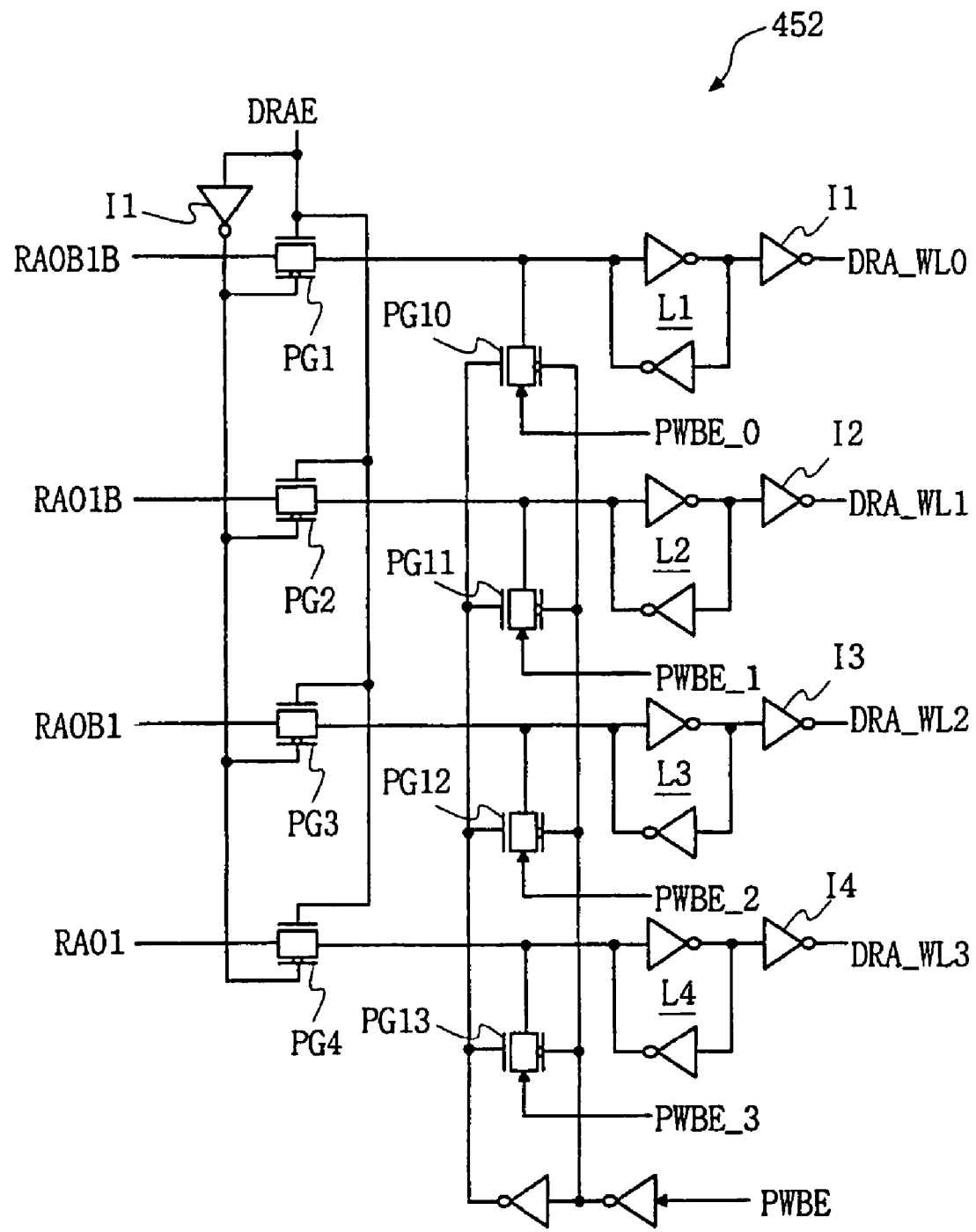
FIG. 8 is a detailed circuit diagram of an internal address generating unit shown in FIG. 4.

FIG. 8 is an example of a detailed circuit diagram of the row address decoder 452 shown in FIG. 4. The row address decoder 452 is composed of transmission gates PG1 to PG4 respectively in series with latches L1 to L4 and inverters I1 to I4, and transmission gates PG10 to PG13 connected as shown. In the normal operation of the memory device, as a decoder enable DRAE becomes high, the row address decoder generates row addresses DRA_WL0 to DRA_WL3 in response to normal addresses RA01 to RA0B1B. However, in the wafer burn-in, as the decoder enable DRAE becomes logic low, the normal address input path is blocked, and the row address decoder generates row addresses DRA_WL0 to DRA_WL3 in response to the wafer burn-in enable signal PWBE turning on the transmission gates PG10 to PG13 to transmit the burn-in addresses PWBE0 to 3 to the respective latches L1 to L4.

Figure 9:
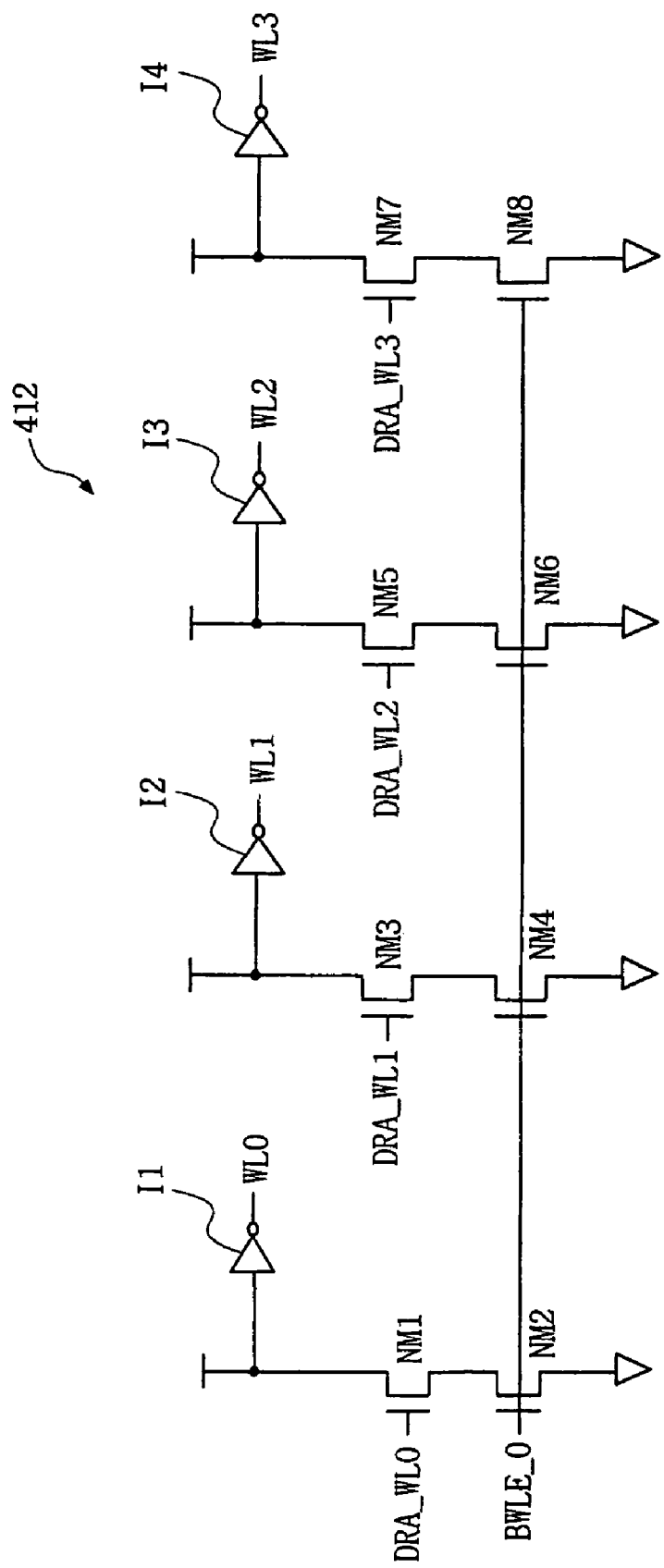
FIG. 9 is a circuit diagram of a word line driver shown in FIG. 4.

FIG. 9 is an example of a circuit diagram of the word line driver 412 shown in FIG. 4.

The word line driver activates a corresponding word line WLØ to WL3 in a relevant memory block in response to the block word line enable signals BWLE_E and BLWE_O and the row addresses DRA_WL0 to DRA_WL3.

A method for wafer burn-in test in a semiconductor memory device shown in FIG. 4 will be now described with reference to FIGS. 5 to 9.

First, the wafer burn-in write operation into a memory cell connected to the even word lines WL0 and WL2 in the odd memory block 410 will be described.

The wafer burn-in enable signal PWBE is set to be high through an external pad. To activate the even word lines WL0 and WL2 in the odd memory block, a low voltage is applied to the block address BADD0, a low voltage to BADD1, and a high voltage to the addresses A0 and A2. The burn-in block control unit 441 generates a high block control signal PWBE_O corresponding to the odd memory block in response to the wafer burn-in enable signal PWBE and block addresses BADD0 and BADD1. The block decoder 442 generates a high odd memory block word line enable signal BWLE_O in response to the wafer burn-in enable signal PWBE and the block control signal PWBE_O.

The burn-in address control unit 451 generates high burn-in addresses PWBE_0 and PWBE_2 in response to the wafer burn-in enable signal PWBE and the external addresses A0 and A2.

The row address decoder 452 generates high internal low addresses DRA_WL0 and DRA_WL2 in response to the wafer burn-in enable signal PWBE and the burn-in addresses PWBE_0 and PWBE_2.

The word line driver 412 activates the word lines WL0 and WL2 in response to the block control signal PWBE_O for the odd memory block and the internal low addresses DRA_WL0 and DRA_WL2. In other words, the word line driver 412 activates only WL0 and WL2 for the odd memory block and not WL0 and WL2 for the even memory block.

After the word lines WL0 and WL2 are activated, a voltage to be written to the memory cell is applied to the voltage supply terminal of the voltage equalizing circuit 240.

The applied voltage is passed to the bit line and the inverted bit line by the voltage equalizing means. Since only WL0 and WL2 in the odd memory block are activated, the applied voltage is written to only the memory cells connected to WL0 and WL2 in the odd memory blocks.

Similarly, it is possible to perform the write operation as described above on WL1 and WL3 in the odd memory blocks after high addresses A1 and A3 are applied.

Similarly, when data is written to memory cells connected to word lines in even memory blocks, high block addresses BADD0 and high addresses A0, A1, A2 and A3 are applied and then the above-described operation is performed.

As described above, the sensing operation is performed by activating all word lines in all memory blocks after data is written to the memory blocks. In the sensing operation, a high block address BADD1 is applied and high addresses A0, A1, A2 and A3 are applied and then the sensing enable signal PSE as shown in FIG. 3 is enabled to operate the sense amplifier 230. Because a different voltage (data) is written to the memory cells connected to the bit lines in the odd memory blocks and the memory cells connected to the inverted bit lines in the even memory blocks, amplifying operation is made possible at the sense amplifier.

Upon performing a wafer burn-in test on a memory device having an open bit line cell structure with the above-mentioned method, data is allowed to be individually applied to odd memory blocks and even memory blocks, thus enabling wafer burn-in sensing operation in the memory device having the open bit line cell structure.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

With the present invention, it is possible to efficiently screen defects of memory cells and between bit lines by performing a wafer burn-in test using a wafer burn-in scheme on a memory device having an open bit line cell structure.

What is claimed is:

1. A memory device comprising:
   a sense amplifier having first and second input terminals;
   a bit line connected to the first input terminal of the sense amplifier and extended in a first direction;
   an inverted bit line connected to the second input terminal of the sense amplifier and extended in a second direction; and
   a voltage supply means for applying the same voltage to the bit line and the inverted bit line in a precharge operation mode and applying a different level voltage to the bit line and the inverted bit line in a burn-in test operation mode.

2. The memory according to claim 1, wherein the voltage supply means comprises:
   a voltage supply terminal;

a first transistor for connecting the bit line to the voltage supply terminal in response to an applied precharge operation signal;

a second transistor responsive to an inverted version of an applied burn-in test operation signal and connected to the first transistor in series and to the voltage supply terminal;

a third transistor connected to the second transistor in series and responsive to the precharge operation signal to connect the inverted bit line to the voltage supply terminal;

a fourth transistor connected to the voltage supply terminal and responsive to the burn-in test operation signal; and an inverter for inverting an output of the fourth transistor to apply a voltage different from a voltage on the bit line to the inverted bit line.

3. A memory device comprising:

first and second memory blocks composed of cells having an open bit line structure and adjacent to each other;

a burn-in block selecting unit for outputting a first or second burn-in block enable signal for a relevant memory block in response to a burn-in signal and a memory block address;

an internal address generating unit for generating an internal low address in response to the burn-in signal and the external address; and a row decoder for enabling the word line in response to the internal low address and the burn-in block enable signal for the memory block.

4. The memory device according to claim 3, wherein the burn-in block selecting unit comprises a block decoder, the block decoder comprising a first path responsive to the memory block address in normal operation and a second path for generating the burn-in block enable signal in response to the burn-in signal in burn-in test.

5. The memory device according to claim 3, wherein the internal address generating unit comprises a row address decoder, the row address decoder comprising a first path responsive to the external address signal in normal operation and a second path for generating a burn-in address in response to the burn-in signal in burn-in test.

6. A semiconductor memory device comprising:

sense amplifiers;

bit lines connected to the sense amplifiers and formed in a first direction;

inverted bit lines connected to the sense amplifier and formed in a second direction;

a first memory block having memory cells formed at intersection regions of the bit lines and word lines;

a second memory block having memory cells formed at intersection regions of the inverted bit lines and the word lines;

a block decoder for selecting the first or second memory block in response to a burn-in signal and a block address of the first memory block or a block address of the second memory block;

a row address generating unit for generating an internal low address in response to the burn-in signal and an external address; and a row decoder for activating a word line of the corresponding memory block in response to an output of the block decoder and the internal low address output.

7. The device according to claim 6, comprising a voltage supply means for applying the same voltage to the bit line and the inverted bit line in response to the burn-in signal.

8. A burn-in testing method comprising:

applying a burn-in signal;

applying a first memory block address and a word line selection address;

generating a first block enable signal in response to the burn-in signal and the first memory block address;

generating an internal address in response to the burn-in signal and the address; and activating word lines in a relevant memory block in response to the first block enable signal and the internal address.

9. The method according to claim 8, further comprising writing data to memory cells through a voltage equalizing circuit after activating the word lines.

10. The method according to claim 9, further comprising:

applying an address for a second memory block adjacent to the first memory block and a word line selection address;

activating word lines in the second memory block; and writing data to memory cells in the second memory block through the voltage equalizing means.

11. The method according to claim 10, further comprising:

activating the word lines in the first memory block and the second memory block; and applying a sense amplifier enable signal.

* * * * *

UNITED STATES PATENT AND TRADEMARK OFFICE
CERTIFICATE OF CORRECTION

PATENT NO. : 7,245,542 B2 Page 1 of 1
APPLICATION NO. : 11/223321
DATED : July 17, 2007
INVENTOR(S) : Ki-Won Park et al.

It is certified that error appears in the above-identified patent and that said Letters Patent is hereby corrected as shown below:

Column 3, line 29, the word "/BL_Ø" should read -- /BL_0 --;
Column 3, line 44, the word "/BL_Ø" should read -- /BL_0 --;
Column 4, line 36, the word "BWLE_E" should read -- BLWE_E --;
Column 4, line 36, the word "BLWB_O" should read -- BLWE_O --;
Column 5, line 11, the word "NV1" should read -- INV1 --;
Column 5, line 34, the word "WLØ" should read -- WL0 --.

Signed and Sealed this

Twelfth Day of August, 2008

JON W. DUDAS
*Director of the United States Patent and Trademark Office*